US012685018B2

(12) United States Patent
Keßeler

(10) Patent No.: US 12,685,018 B2
(45) Date of Patent: Jul. 14, 2026

(54) METHOD AND SYSTEM FOR COOLING OF A DEVICE

(71) Applicant: K2 Capital GmbH, Siegburg (DE)

(72) Inventor: Harry Keßeler, Cologne (DE)

(73) Assignee: K2 Capital GmbH, Cologne (DE)

( * ) Notice: Subject to any disclaimer, the term of this patent is extended or adjusted under 35 U.S.C. 154(b) by 76 days.

(21) Appl. No.: 18/449,854

(22) Filed: Aug. 15, 2023

(65) Prior Publication Data

US 2023/0389425 A1 Nov. 30, 2023

Related U.S. Application Data

(63) Continuation of application No. PCT/DE2022/000012, filed on Feb. 5, 2022.

(30) Foreign Application Priority Data

Feb. 15, 2021 (DE) .......................... 102021000757.3

(51) Int. Cl.
 *H10N 10/13* (2023.01)
 *F24S 20/40* (2018.01)
(52) U.S. Cl.
 CPC .............. *H10N 10/13* (2023.02); *F24S 20/40* (2018.05)
(58) Field of Classification Search
 CPC .................................. H10N 10/13; F24S 20/40
 See application file for complete search history.

(56) References Cited

U.S. PATENT DOCUMENTS

| | | | | | |
|---|---|---|---|---|---|
| 5,590,532 | A | * | 1/1997 | Bachman | B67D 1/0869 |
| | | | | | 62/3.3 |
| 6,880,346 | B1 | * | 4/2005 | Tseng | H10N 10/13 |
| | | | | | 257/E23.099 |
| 2003/0070430 | A1 | * | 4/2003 | Beckius | A47J 27/21 |
| | | | | | 60/645 |
| 2004/0025515 | A1 | * | 2/2004 | Evans | G11B 15/6835 |

(Continued)

FOREIGN PATENT DOCUMENTS

| | | |
|---|---|---|
| CN | 108448944 A | 8/2018 |
| DE | 2457951 A1 | 7/1975 |

(Continued)

OTHER PUBLICATIONS

Ellsworth (Year: 2012).*

(Continued)

*Primary Examiner* — Sadie White

(74) *Attorney, Agent, or Firm* — Burris Law, PLLC

(57) ABSTRACT

A method and system for cooling a device includes a first device that generates a first heat flow dependent upon operation. A space surrounding the first device absorbs the first heat flow and a second device differentiated from the first device generates a second heat flow dependent upon operation. A thermal conduction system which thermally couples the second device and the first device conducts the second heat flow to the first device for the purpose of cooling the second device, and the first device completely or essentially completely absorbs the second heat flow, wherein none of the fluid flowing within the thermal conduction system is compressed or expanded. The first device completely or essentially completely absorbs the second heat flow.

13 Claims, 2 Drawing Sheets

(56)          References Cited

U.S. PATENT DOCUMENTS

| | | | | |
|---|---|---|---|---|
| 2005/0073150 A1* | 4/2005 | Patel | H10N 10/00 | |
| | | | | 290/1 R |
| 2008/0037217 A1* | 2/2008 | Murakami | H05K 7/206 | |
| | | | | 361/695 |
| 2009/0139556 A1* | 6/2009 | Bell | F01P 9/06 | |
| | | | | 136/201 |
| 2009/0205694 A1* | 8/2009 | Huettner | H10N 10/13 | |
| | | | | 136/238 |
| 2009/0301687 A1* | 12/2009 | Watts | H10N 10/00 | |
| | | | | 126/714 |
| 2010/0043858 A1* | 2/2010 | Matsui | H10N 10/10 | |
| | | | | 361/689 |
| 2012/0049783 A1* | 3/2012 | Chang | H10N 10/10 | |
| | | | | 320/101 |
| 2012/0199171 A1* | 8/2012 | Watts | H10N 10/13 | |
| | | | | 136/212 |
| 2013/0091868 A1* | 4/2013 | Campbell | H05K 7/203 | |
| | | | | 62/3.2 |
| 2021/0092875 A1 | 3/2021 | Hellmann-Regen | | |
| 2021/0262706 A1* | 8/2021 | Jaffrey | H10N 10/17 | |

FOREIGN PATENT DOCUMENTS

| | | | |
|---|---|---|---|
| EP | 2138775 A2 | 12/2009 | |
| JP | 2012042105 A | 3/2012 | |

OTHER PUBLICATIONS

Zhu (Year: 2020).*
International Search Report issued in corresponding International
Application PCT/DE2022/000012, mailed May 19, 2022.

* cited by examiner

METHOD AND SYSTEM FOR COOLING OF A DEVICE

CROSS-REFERENCE TO RELATED APPLICATIONS

This application is a continuation of International Application No. PCT/DE2022/000012, filed on Feb. 5, 2022, which claims priority to and the benefit of DE 10 2021 000 757.3 filed on Feb. 15, 2021. The disclosures of the above applications are incorporated herein by reference.

FIELD

The present disclosure relates to a method for cooling of a device.

BACKGROUND

The statements in this section merely provide background information related to the present disclosure and may not constitute prior art.

Cooling methods are known in various configurations and serve to absorb a heat flow generated by a device dependent upon operation. Through the absorption of the heat flow, which is also known as thermal output, a heat, or heat loss, is conducted away from or evacuated from the device, which correlates with a reduction of an operating temperature of the device. A reduction of the operating temperature of the device due to evacuation of the heat loss of the device is usually known as cooling of the device.

Every device which generates a strong heat flow due to a high dissipation loss, at least a high electrical dissipation loss, does not operate optimally, in particular does not operate with maximum degree of efficiency, or quickly shuts down, or can even be destroyed, when it is operated above an individual maximum operating temperature. Therefore, cooling of the device during operation is essential for optimal operation, a long lifespan, or long-term operation of a device.

JP 2012-42105 A describes a cooling method for a data center which uses a heat flow generated by the data center to heat water in a hot water tank.

DE 245 7951 A1 discloses a cooling method for a computer which uses a heat flow generated by the computer to warm water in a consumer circuit or a central heating system.

The heat, more precisely referred to as thermal energy or heat energy, which is conducted away from the device by means of cooling is preserved as every form of energy; that is to say, it can be converted, but not destroyed. It therefore inevitably enters the space surrounding the device, and thus into the environment, as a continuous heat influx, where it can lead to undesired warming of the climate.

This unfavorable circumstance is also not altered in that the heat flow generated by the device dependent upon operation is conducted to an additional device via a thermal conduction system and is completely or essentially completely, that is to say, almost completely, absorbed by the additional device. In this case, the heat flow generated by the device only enters into the space surrounding the additional device as a continuous heat influx rather than into the space surrounding the device and ultimately contributes to the warming of the climate to the same extent.

SUMMARY

This section provides a general summary of the disclosure and is not a comprehensive disclosure of its full scope or all of its features.

The present disclosure proposes a method for cooling of a device which reduces thermal stress on the environment as a result of the heat influx into the environment caused by the cooled device. Furthermore, the present disclosure introduces a system for the cooling of a device.

The present disclosure provides a method for cooling of a device, in which a continuously operated first device generates a first heat flow dependent upon operation, a space surrounding the first device absorbs the first heat flow, a second device differentiated from the first device generates a second heat flow dependent upon operation, a thermal conduction system which thermally couples the second device and the first device conducts the second heat flow to the first device for the purpose of cooling the second device, and the first device completely or essentially completely absorbs the second heat flow. In the context of the present disclosure, the second device is a heat source which is to be cooled and the first device is a heat sink which can be cooled. As used herein, the terms "complete" or "essentially complete" absorption is to be understood as an absorption with the exception of an unavoidable thermal loss.

At least one fluid flows within the thermal conduction system, which conducts the second heat flow from the second device to the first device. No fluid flowing within the thermal conduction system is thereby compressed or expanded. When a liquid fluid flows within the thermal conduction system, the compression or expansion of the fluid is practically excluded due to the incompressibility of liquids. When a gaseous fluid flows within the thermal conduction system, however, the compression or expansion of the fluid is possible. However, in this case the present disclosure also relates exclusively to those thermal conduction systems which neither compress nor expand the gaseous fluid.

In one form, a second device is cooled, which is continuously operated and generates a temporally essentially constant strong heat flow. Thus the method is particularly ideal for a second device which is operated for long periods of time and which has a strong cooling requirement due to a high thermal output, which otherwise severely thermally impacts the environment due to a continuously high heat influx into the space surrounding the second device.

It is noted that, due to the absorbed second heat flow, it is desirable that the first device will be operated at a higher operating temperature, that is, at a new operating point, which differs from an original operating point of the first device, that is, an operating point without the absorption of the second heat flow. The operation of the first device at the new operating point must therefore be compliant with the applicable requirements of the first device or with the standards to be fulfilled by the first device.

The present disclosure provides a device which automatically reduces an operationally-dependent power consumption corresponding to the second heat flow as used as the first device. By reducing the operationally-dependent power consumption, the first device automatically compensates for the absorbed second heat flow. In particular, a given device with the ability to automatically compensate for an absorbed external heat flow can be used as the first device, which correlates with a particularly economically favorable application of the method. However, the first device can also be set up in favor of the method.

To this end, the reduced power consumption of the first device correlates with a lower energy consumption of the first device. A correspondingly lower amount of energy is required for the operation of the first device, which also correlates with a reduced environmental load, in one form, a reduced heat influx into the environment. Thanks to the method, a heat influx into the environment is reduced both directly, through compensation of the second heat flow, as well as indirectly, due to a lower power consumption of the first device.

It is desired that a first device is used, the first heat flow of which is at least as strong as the second heat flow. With this prerequisite, the second heat flow can be completely or at least essentially completely compensated by the first heat flow, that is to say, completely encompassed by the first heat flow. The absorbed second heat flow does not alter the first heat flow in this case. In other words, the first heat flow generated by the first device is not increased due to the absorption of the second heat flow. In this way, no heat flow or essentially no heat flow needs to be absorbed by the space surrounding the second device and the space surrounding the first device does not need to absorb a stronger first heat flow than would be the case without the operation of the second device. Correspondingly, the second device is operated effectively without any appreciable thermal stress on the environment, whereby warming of the climate is counteracted.

Conversely, if a first device is used which has a first heat flow that is stronger than the absorbed second heat flow, then the first heat flow only increases in strength by a difference between the second heat flow and the first heat flow, that is to say, the effective heat influx of the second device into the environment is at least reduced by the original heat influx of the first device. Correspondingly, the second device is operated effectively with a low thermal stress on the environment, whereby warming of the climate is also counteracted, even if to a lesser extent.

In one form, a potable water supply is used as the first device. The potable water supply is continuously operated and includes at least one waterworks supplying potable water, that is water intended for drinking, and a pipe network extending from the waterworks to a plurality of consumption points, which conducts the potable water provided by the waterworks to the consumption points. In many cases, the use of the potable water includes the heating of the potable water at the consumption points, for example, in a heating system for a building or by means of a flow heater located in a building, to a specific usage temperature. A decentralized energy usage for the heating of the potable water at the consumption points is part of an operational power consumption of the potable water supply.

After the use of the potable water, for example a bath, shower, washing dishes, or laundry in private households, the potable water is conducted as heated wastewater through a pipe system to a wastewater treatment facility. The same applies correspondingly for industrial use of the potable water.

The wastewater treatment facility presents a heat flow due to the heated wastewater, which is absorbed by the space surrounding the wastewater treatment facility. Thus, the operational heat influx of the potable water supply into the environment takes place exclusively, at least essentially, via the wastewater treatment facility.

When the potable water supply provides potable water that has been heated as a result of the absorption of the second heat flow to consumption points, the heating of the potable water at the consumption points to the determined temperature uses a correspondingly lower amount of energy, which automatically reduces the operational power consumption of the potable water supply.

Generally, specific regulations concerning a temperature of the potable water provided apply to the potable water supply, in particular, the waterworks. For example, it can be stipulated that the temperature of the potable water processed and provided by the waterworks should lie between 6° C. and 18° C., and may not exceed 20° C. In many cases, the inlet temperature of the water flowing into the waterworks is less than 10° C. The potable water supply can thus be operated with a higher operating temperature, that is at a new operating point, without violating the applicable regulations. If the potable water supply is used for the purpose of cooling of, for example, a data center, then a new operating point is realistic, which lies only approximately 0.5° C. above the original operating point and still markedly within the stipulated range.

The potable water supply is particularly beneficial as the first device because of a high specific thermal capacity of water and thanks to a large continuously processed and provided amount of water. Additionally, the potable water supply is typically available and does not need to be set up for the purpose of the method.

In an additional form, a data center provides the second heat flow as the second device. A data center is designed for long-term operation, exhibits an extremely high level of availability, and is intended to be in continuous operation. The data center includes a large number of IT (Information Technology) components, in particular processors (central processing units, CPUs (Central Processing Units)), data storage, network components, and the like, which in total exhibit an extremely high electrical power consumption and a correspondingly high electrical dissipation loss during normal operation.

Due to the electrical dissipation loss, the IT components heat up strongly and must therefore be cooled just as strongly. Cooling of the IT components is typically effected by means of a flowing cooling fluid, for example, a flowing cooling gas such as air or a flowing cooling liquid such as water. The flowing cooling fluid absorbs the heat of the IT components and presents this as the heat flow of the data center. When the cooling fluid is conducted into a space surrounding the data center, the surrounding space absorbs the heat flow which was absorbed and conducted away by the cooling fluid. Considering the magnitude of the continuous heat influx of just a single data center into the environment and simultaneously the large and ever-growing number and surface density of data centers worldwide, an ecological benefit for the environment is particularly high when the data center is used as the second device.

A new data center can advantageously be constructed adjacent to a waterworks in order to reduce the spatial separation which is bridged by the thermal conduction system.

A second fluid flowing in a closed second circuit of the thermal conduction system advantageously conducts the second heat flow from the second device to a second side of a heat exchanger of the thermal conduction system, and a first fluid flowing in a closed first circuit of the thermal conduction system which is separate from the second circuit conducts the second heat flow from a first side of the heat exchanger to the first device. The thermal conduction system can include two closed circuits which are fluidly separated from one another, within each of which a fluid flows, in one form, circulates. Each circuit includes a plurality of pipes and can include a plurality of subcircuits.

Each fluid can include water or consist of water. Water exhibits a high specific heat capacity, and thanks to the high specific heat capacity, it is particularly suitable as a fluid. However, other liquids or gases can also be used as the first fluid or the second fluid. In one form, the fluid flowing in the first circuit can be different from the fluid flowing in the second circuit.

The thermal conduction system advantageously also includes a heat exchanger, which can also be known as a recuperator, and is designed for example as a tube bundle heat exchanger. The heat exchanger effects an indirect heat exchange between the first circuit and the second circuit and ensures a material separation of both fluids. In other words, the fluid flowing in the first circuit does not enter the second circuit and the fluid flowing in the second circuit does not enter the first circuit. Only a heat flow provided by the second fluid is absorbed by the first fluid. In other words, the second fluid is cooled by the first fluid via the heat exchanger, or rather, the first fluid is warmed by the second fluid via the heat exchanger.

In one form, in a normal operating mode of the thermal conduction system, the second fluid flows from the second device and from the second side of the heat exchanger to a thermoelectric generator of the thermal conduction system and from the thermoelectric generator to the second side of the heat exchanger, the thermoelectric generator generates electrical power via a temperature difference between a first inlet temperature of the second fluid and a second inlet temperature of the second fluid, and the thermoelectric generator supplies the electrical power generated for the operation of the thermal conduction system and/or of the second device. The thermal conduction system can include a thermoelectric generator. In a nutshell, a temperature gradient, that is, a temperature difference, generated by the second device is used to generate electrical energy via the thermoelectric generator. The thermoelectric generator provides the thermal conduction system and/or the second device with an electric current, whereby the use of external energy by the thermal conduction system and/or the second device is reduced. The reduced usage of external energy correlates with a reduced environmental stress from the second device and/or the thermal conduction system.

The thermoelectric generator can generate the electrical energy by means of the Seebeck effect, the Peltier effect, and/or the Thomson effect.

It is advantageous that the second fluid flows from the second device to a solar heating system of the thermal conduction system which generates a third heat flow, and from the solar heating system to the thermoelectric generator, and that the solar heating system increases the working temperature and the solar heating system increases the temperature difference. The thermal conduction system can include a solar heating system. Thanks to the temperature difference, which is increased by the solar heating system, the thermoelectric generator generates more electrical energy. In this way, the usage of external energy by the second device and/or the thermal conduction system is further reduced. The further reduced usage of external energy correlates with a further reduced environmental stress from the second device and/or the thermal conduction system.

Alternatively or additionally, the second fluid flows from the second device to a heat accumulator and from the heat accumulator to the second device and to the thermoelectric generator, and the heat accumulator increases the working temperature and the heat accumulator increases the temperature difference. The thermal conduction system can include a heat accumulator. Thanks to the temperature difference, which is increased by the heat accumulator, the thermoelectric generator generates more electrical energy. In this way, the usage of external energy by the second device and/or the thermal conduction system is further reduced. The further reduced usage of external energy correlates with a further reduced environmental stress from the second device and/or the thermal conduction system.

The heat accumulator can include a storage tank for the second fluid. A storage temperature of the second fluid which is stored in the storage tank of the heat accumulator, which indicates an amount of thermal energy stored in the heat accumulator, may not exceed a maximum cooling temperature of the second fluid, which is just low enough to cool the second device. By setting the storage temperature, an operating point of the thermal conduction system can be set such that a higher possible inlet temperature of the thermoelectric generator can be achieved with a higher possible operating temperature of the second device, that is to say, a just barely sufficient cooling efficiency of the thermal conduction system.

Ideally, the heat accumulator and the thermoelectric generator are combined with one another to increase the degree of efficiency of the second device and/or of the thermal conduction system and to reduce the environmental impact such that the second fluid flows out of the second device first through the heat accumulator and then through the solar heating system to the thermoelectric generator.

In one form, the second fluid flows from the second side of the heat exchanger into a storage buffer of the thermal conduction system and from the storage buffer to the second side of the heat exchanger, to the heat accumulator, and to the thermoelectric generator. The storage buffer serves as a storage buffer and as a hydraulic separator between the subcircuits of the second circuit. In its function as a storage buffer, it enables the setting of the storage temperature for the heat accumulator, whereby the efficiency of the thermal conduction system is improved. In its function as a hydraulic separator, it enables the adjustment of volumetric flow rates in subcircuits of the second circuit.

Alternatively, in an emergency operating mode of the thermal conduction system which differs from the normal operating mode, the second fluid flows from the second side of the heat exchanger directly into the second device and from the second device directly back into the second side of the heat exchanger. The emergency operating mode or also the maintenance operating mode of the thermal conduction system is provided in order to cool the second device when cooling of the second device in the normal operating mode is not possible due to maintenance or a failure of the heat accumulator, the solar heating system, the electromagnetic generator, or the storage buffer. Thanks to the emergency operating mode of the thermal conduction system, the cooling method has a redundancy, and has a high level of availability due to the redundancy.

The thermal conduction system advantageously includes a primary heat exchanger exclusively for the normal operating mode of the thermal conduction system and a secondary heat exchanger exclusively for the emergency operating mode of the thermal conduction system. In the normal operating mode, the first fluid and the second fluid flow through the primary heat exchanger. In the emergency operating mode, the first fluid and the second fluid flow through the secondary heat exchanger.

In other forms, a sensor of the thermal conduction system measures a physical property of the thermal conduction system, a pump of the thermal conduction system sets a volumetric flow rate of the first fluid or the second fluid, and a valve of the thermal conduction system releases the flow of the first fluid or the second fluid or blocks the flow of the first fluid or the second fluid, and a control unit of the thermal conduction system controls the pump and the valve depending upon the measured physical property. The control unit is connected with every sensor, every pump, and every valve of the thermal conduction system and controls the thermal conduction system by automatically actuating every pump and every valve. The control unit can define one or multiple control circuits for controlling the thermal conduction system and can control the pump and the valve corresponding to the defined control circuits.

The thermal conduction system includes a plurality of sensors for measuring a temperature, that is, temperature sensors, as the physical property. Specifically, a temperature sensor can measure a temperature of the surrounding space, a temperature of the first device, a temperature of the second device, or a temperature of the first fluid or the second fluid. Correspondingly, the temperature sensor can be located in the surrounding space, in the first device, in the second device, in the storage buffer, in the heat accumulator, in the solar heating system, or in the electromagnetic generator. In one form, a temperature sensor can measure a temperature of a processor, an air temperature of a hot aisle, or an air temperature of a cold aisle if the second device is designed as a data center.

Furthermore, the thermal conduction system can include a plurality of sensors to measure a volumetric flow rate, that is, flow sensors, as the physical property. Specifically, a flow sensor can measure a volumetric flow rate of the first fluid or the second fluid.

Furthermore, the control unit can receive an operational parameter, for example, processor load, power consumption, or a characteristic value, in one form, a degree of efficiency (Power Usage Effectiveness, or PUE) from the second device and control the pump or the valve depending upon the received operational parameter.

An additional subject of the present disclosure is a thermal conduction system for cooling a device, which thermally couples a first device which is intended for continuous operation and generates a first heat flow with a second device which generates a second heat flow. The thermal conduction system is designed to conduct the second heat flow to the first device.

The thermal conduction system includes neither a compressor nor an expander. In other words, the thermal conduction system is designed to neither compress nor expand a fluid which flows through the thermal conduction system.

The thermal conduction system according to the present disclosure is configured to cool the second device by means of the first device by performing a method according to the present disclosure. In this way, the thermal conduction system ensures that the space surrounding the second device does not absorb any heat flow and the space surrounding the first device only absorbs a portion of the second heat flow which exceeds the first heat flow and reduces power consumption of the first device. Both effects reduce the thermal load on the environment and counteract a warming of the climate.

Components of the thermal conduction system, that is, at least partially the first circuit or the second circuit respectively, the heat exchanger, the heat accumulator, the solar heating system, the thermoelectric generator, and the storage buffer, can be designed as a compact assembly group. The compact assembly group can be located adjacent to the first device or adjacent to the second device. Alternatively, the compact assembly group can also be spatially integrated into the first device or into the second device.

An advantage of the method according to the present disclosure is that the heat flow generated by the first device warms neither a space surrounding the first device nor a space surrounding the second device. Correspondingly, a $CO_2$ emission from the first device equivalent to the thermal output is low. Consequently, the environmental load caused by operating the first device is reduced or avoided. Furthermore, it is advantageous that a device which is ideal as a first device is at least already present, which results that an implementation of the method is very economically favorable.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Identical components are marked with identical reference numbers in the illustrations.

Figure 1:
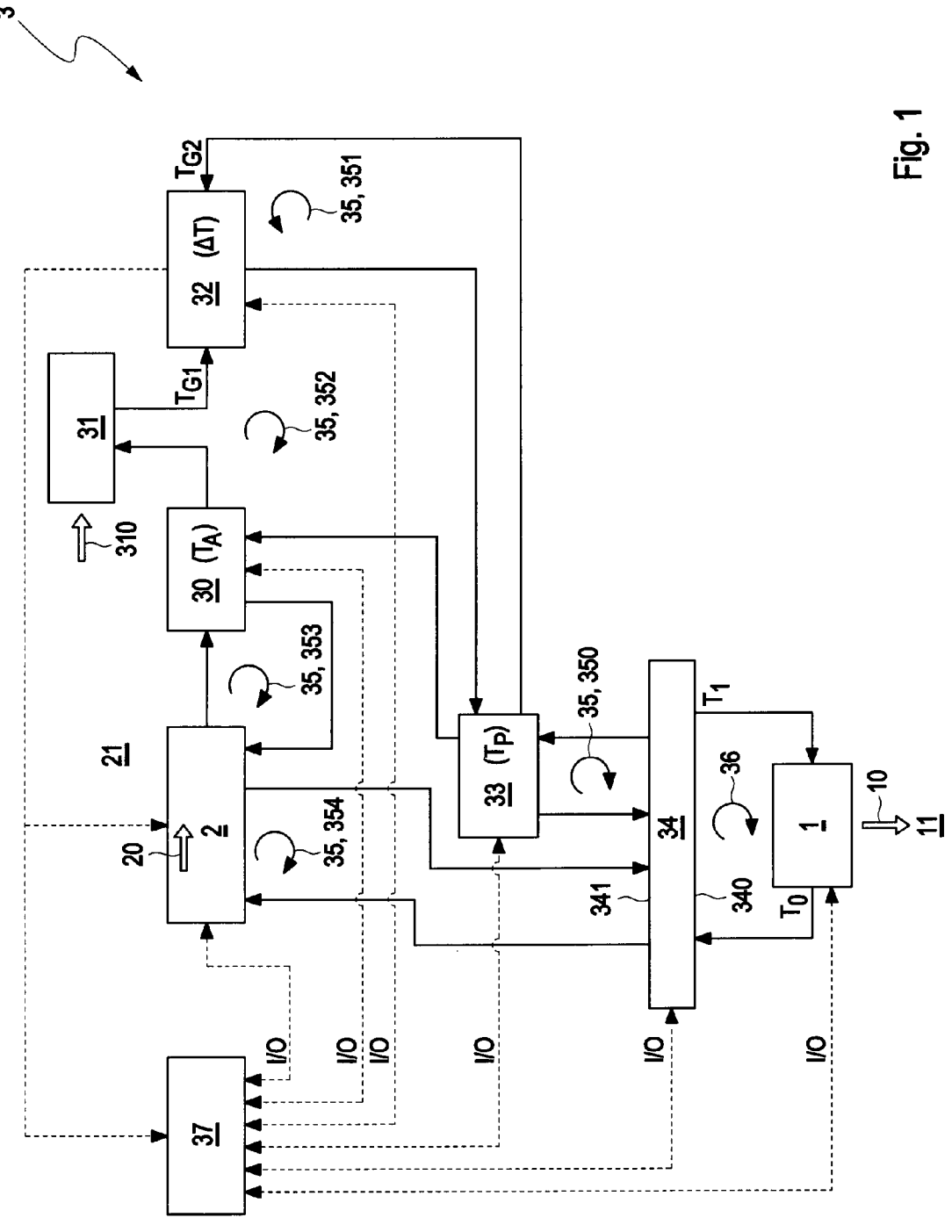
FIG. 1 is a schematic depiction of a thermal conduction system according to one form of the present disclosure for cooling of a device.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows in a schematic depiction a thermal conduction system 3 according to one form of the present disclosure for cooling of a device. The thermal conduction system 3 thermally couples a first device 1 and a differing second device 2.

The first device 1 is located and designed in a first space 11 to generate a first heat flow 10 dependent upon operation.

The second device 2 differs from the first device 1 and is located and designed in a second space 21 to generate a second heat flow 20. Ideally, the second device 2 is thermally isolated from the second space 21 by means of thermal insulation. The second space 21 can be located separate from the first space 11, that is to say, the second device 2 can be located separate from the first device 1.

Figures 2, 3, 4, 5:
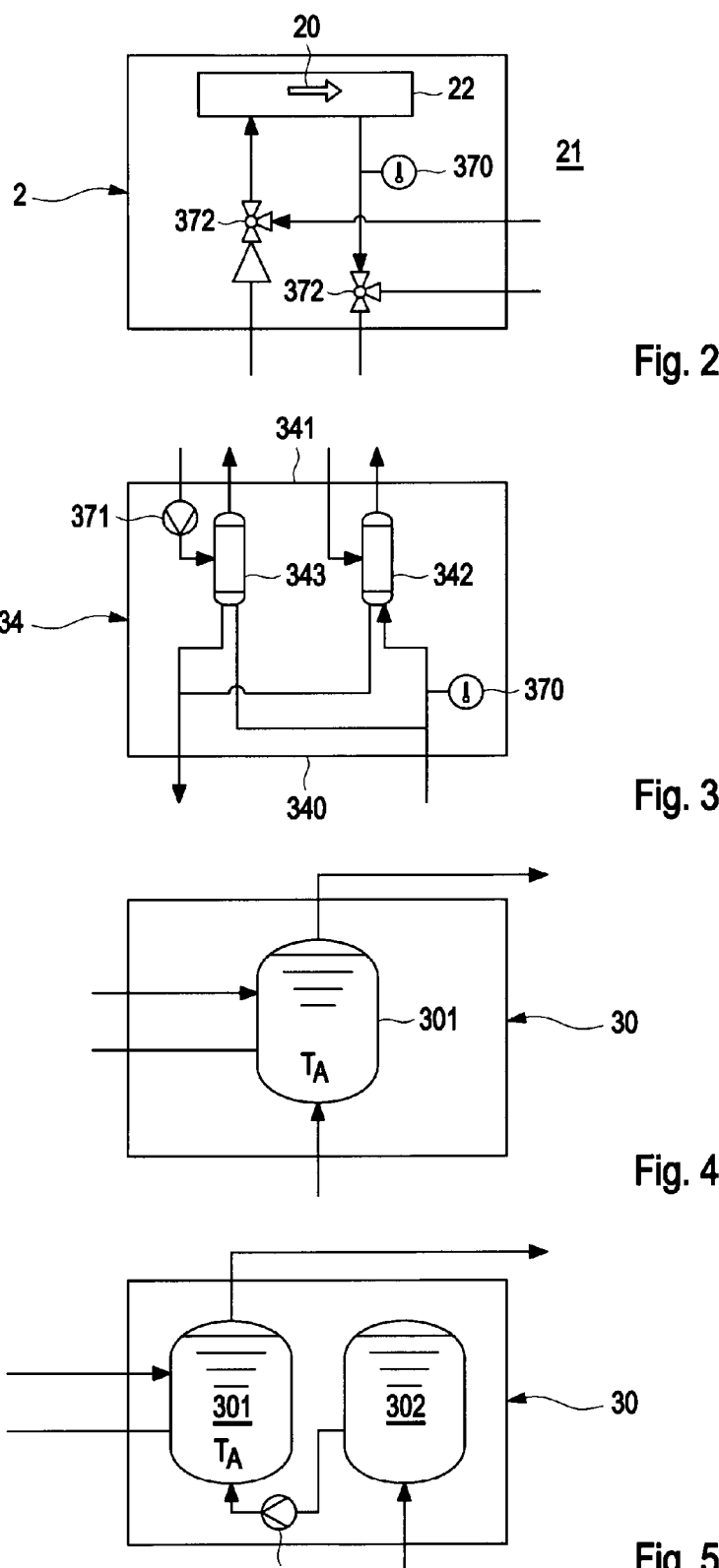
FIG. 2 is an enlarged detail view of the second device to be cooled by the thermal conduction system depicted in FIG. 1.
FIG. 3 is an enlarged detail view of the heat exchanger of the thermal conduction system depicted in FIG. 1.
FIG. 4 is an enlarged detail view of the heat accumulator of the thermal conduction system depicted in FIG. 1.
FIG. 5 is an enlarged detail view of a heat accumulator according to an additional form of the present disclosure.

FIG. 2 shows in an enlarged detail view the second device 2 to be cooled by the thermal conduction system 3 depicted in FIG. 1. The second device 2 is preferably designed as a data center. The data center is designed as the second device 2 to generate the second heat flow 20. The data center includes a facility 22 with a plurality of IT components, for example, processors, data storage, network components, and the like, which generate the second heat flow 20 during operation of the data center.

Furthermore, two valves 372 of the thermal conduction system 3 can be located in the second device 2, which are fluidly connected via the facility 22. The valves 372 are designed, for example, as three-way valves, but can also be designed alternatively as pairs of check valves. In the second device 2, a temperature sensor can additionally be located as a sensor 370 of the thermal conduction system 3 for measuring a temperature of the second cooling fluid.

Returning to FIG. 1, the thermal conduction system 3 includes, for example, a closed first circuit 36 and a closed second circuit 35 which is separate from the first circuit 36. The second circuit 35 can include a plurality of subcircuits 350, 351, 352, 353, 354. Belonging to each circuit 35, 36 are a plurality of pipes, which are thermally isolated from a space surrounding the circuits 35, 36 by means of thermal insulation, that is to say, a space surrounding the circuits 35, 36 absorbs none or essentially none of the heat flow generated by the circuits 35, 36. The pipes are each respectively depicted as a connecting arrow, wherein a direction of a connecting arrow indicates a flow direction of a fluid flowing within the respective circuit.

Furthermore, the thermal conduction system 3 includes a heat exchanger 34 with a first side 340 and a second side 341. The first device 1 is fluidly connected with the first side of the heat exchanger 34 via the first circuit 36. The second device 2 is fluidly connected with the second side 341 of the heat exchanger 34 via the second circuit 35. The second device 2 is, in one form, directly fluidly connected with the second side 341 of the heat exchanger 34 via the subcircuit 354.

FIG. 3 shows in an enlarged detail view the heat exchanger 34 of the thermal conduction system shown in FIG. 1. The heat exchanger 34 can include a primary heat exchanger 342 and a secondary heat exchanger 343. The primary heat exchanger 342 is fluidly connected with the subcircuit 350. The secondary heat exchanger 343 is fluidly connected with the subcircuit 354. The heat exchanger 34 can include a pump 371 for setting a volumetric flow rate of the second fluid in the subcircuit 354.

The primary heat exchanger 342 and the secondary heat exchanger 343 are respectively fluidly connected with the first circuit 36. The heat exchanger can furthermore include a temperature sensor as a sensor 370 for measuring a temperature of the first cooling fluid.

Returning to FIG. 1, the thermal conduction system 3 can furthermore include a thermoelectric generator 32 for generating of electrical power. The second device 2 is fluidly connected with the thermoelectric generator 32 via the subcircuits 352, 353. The thermoelectric generator 32 is fluidly connected with the second side 341 of the heat exchanger 34 via the subcircuits 350, 351. The thermoelectric generator 32 can generate the electrical energy necessary for generating the electrical power by means of the Seebeck effect, the Peltier effect, and/or the Thomson effect.

Furthermore, a heat accumulator 30 can belong to the thermal conduction system 3. The second device 2 is fluidly connected with the heat accumulator via the subcircuit 353. The heat accumulator 30 is fluidly connected with the thermoelectric generator 32 via the subcircuit 352. In the case of forms without the heat accumulator 30, the subcircuits 352 and 353 coincide.

FIG. 4 shows in an enlarged detail view the heat accumulator 30 of the thermal conduction system 3 shown in FIG. 1. The heat accumulator 30 includes a single storage tank 301.

FIG. 5 shows in an enlarged view a heat accumulator 30 according to an additional form of the present disclosure. The heat accumulator 30 includes two storage tanks 301, 302 which are fluidly connected with one another, and only a single pump 371 as an example, which sets a volumetric flow rate of the two fluids from the storage tank 302 to the storage tank 301. In other forms, the heat accumulator 30 can include more than two storage tanks which are fluidly connected with one another in a cascade fashion.

Returning to FIG. 1, the thermal conduction system 3 can additionally include a solar heating system 31. The solar heating system 31 is advantageously fluidly coupled into the subcircuit 352, that is to say, it is fluidly connected with an outlet of the heat accumulator 30 and an inlet of the thermoelectric generator 32. The solar heating system 31 is designed to generate a third heat flow 310 created by the sun.

A storage buffer 33 can also belong to the thermal conduction system 3. The storage buffer 33 can, like the heat accumulator 30 (see FIGS. 3, 4), include one or a plurality of storage tanks. A plurality of storage tanks of the storage buffer 33 can be fluidly connected with each other in a cascade fashion.

The storage buffer 33 is fluidly connected with the second side 341 of the heat exchanger 34 via the subcircuit 350. The thermoelectric generator 32 is fluidly connected with the storage buffer 33 via the subcircuit 351. The device 2 is fluidly connected with the storage buffer 33 via the heat accumulator 30 and the subcircuit 353. The storage buffer can include one pump each for the subcircuit 350, for the subcircuit 351, and for a supply line to the heat accumulator 30, respectively. In the case of forms without a storage buffer 33, the subcircuits 350 and 351 coincide and the second device 2 is fluidly connected with the second side 341 of the heat exchanger 34 via the heat accumulator 30, where applicable.

The thermal conduction system 3 ideally includes a plurality of sensors 370 for measuring a physical property of the thermal conduction system 3, a plurality of pumps 371 for setting a volumetric flow rate of the first fluid or of the second fluid, a plurality of valves 372 for restricting or releasing the flow of the first fluid or of the second fluid, and a control unit 37 which is functionally connected with every sensor 370, every pump 371, and every valve 372 by means of an electrical line. Every sensor 370 can be designed as a temperature sensor for measuring a temperature, a flow sensor for measuring a volumetric flow rate, or a level sensor for measuring a liquid level. The electrical lines are respectively depicted as a connecting double arrow. In each case, the direction of a connecting arrow indicates a direction of a control signal, and the other direction of a connecting arrow depicts a direction of a sensor signal.

The thermal conduction system 3 includes one respective pump 371 for every subcircuit 350, 351, 352, 353, 354 of the second circuit 35, for the first circuit 36, as well as for every line which does not belong to a circuit 36 or to a subcircuit 350, 351, 352, 353, 354. Every component of the thermal conduction system 3, that is to say, the heat accumulator 30, the solar heating system 31, the thermoelectric generator 32, the storage buffer 33, and the heat exchanger 34, can include a temperature sensor as a sensor 370. Additionally, the thermal conduction system 3 can include a temperature sensor as a sensor 370 located in the first device 1 and in the second device 2, respectively. The heat accumulator 30 and the storage buffer 33 can include a level sensor as a sensor 370 for each storage tank. Furthermore, the thermal conduction system 3 can include one flow sensor as a sensor 370 for every subcircuit 350, 351, 352, 353, 354 of the second circuit 35, for the first circuit 36, as well as for every line which does not belong to a circuit 36 or to a subcircuit 350, 351, 352, 353, 354.

The control unit 37 is functionally connected with the first device 1, the second device 2, and the heat exchanger 34 by one electrical line each, respectively. Furthermore, the control unit 37 can be functionally connected with the thermoelectric generator 32, the solar heating system 31, the heat accumulator 30, and the storage buffer 33 by one electrical line each, respectively. More specifically, the control unit 37 is functionally connected with a sensor 370, a pump 371, or a valve 372, respectively, which are each located in the first device 1 or the second device 2, or which belong to the heat exchanger 34, the thermoelectric generator 32, the solar heating system 31, the heat accumulator 30, or the storage buffer 33.

Furthermore, the control unit 37 and/or the second device 2 can be energetically connected with the thermoelectric generator 32 via electrical lines. The electrical lines are depicted as connecting arrows. One direction of a connecting arrow indicates a respective flow direction of the electrical energy generated by the thermoelectric generator 32.

If the second device 2 includes both of the valves 372 and the heat exchanger 34 includes the primary heat exchanger 342 and the secondary heat exchanger 343, then the second circuit 35 can—depending on the setting of both valves 372—optionally include a first partial circuit, which consists of the subcircuit 354, and a second partial circuit with the subcircuits 350, 351, 352, 353.

The thermal conduction system 3 includes neither a compressor nor an expander and is designed to not compress or expand any fluid flowing within the thermal conduction system 3.

The thermal conduction system 3 is configured to cool the second device 2 by means of the first device 1, to be operated as follows.

The first device 1 is normally operated continuously and generates the first heat flow 10 dependent upon operation. The first space 11 surrounding the first device 1 absorbs the first heat flow 10.

The second device 2 is typically operated continuously and generates the second heat flow 20 dependent upon operation. The thermal conduction system 3 conducts the second heat flow 20 to the first device 1 to cool the second device 2. No fluid flowing within the thermal conduction system is thereby compressed or expanded. The first device 1 absorbs the second heat flow 20.

As a first device 1, a device is used which automatically reduces an operating power corresponding to the second heat flow 20. A potable water supply is preferably used as the first device 1. The potable water supply is designed to automatically reduce an operating power of water heating systems located at consumption points such as heating systems or flow heaters corresponding to the second heat flow 20.

Every sensor 370 of the thermal conduction system 3 measures a physical property of the thermal conduction system 3. The control unit 37 of the thermal conduction system 3 controls every pump 371 and every valve 372 depending upon the measured physical properties. Specifically, every pump 371 of the thermal conduction system 3 sets a volumetric flow rate of the first fluid or the second fluid in the second circuit 35 or in the first circuit 36, and every valve 372 of the thermal conduction system 3 either permits the flow of the first fluid or the second fluid in the second circuit 35 or in the first circuit 36 or blocks the flow of the first fluid or the second fluid in the second circuit 35 or in the first circuit 36.

In every operating mode of the thermal conduction system 3, a first fluid flows in the first circuit 36 from the device 1 with a base temperature $T_0$ to the first side 340 of the heat exchanger 34, absorbs the second heat flow 20 within the heat exchanger 34, and conducts the second heat flow 20 with a transport temperature $T_1$—which is elevated in comparison to the base temperature $T_0$—from the first side 340 of the heat exchanger 34 to the first device 1. The first side 340 can be designated as the cold side of the heat exchanger 34. Water is preferably used as the first fluid and as the second fluid, that is to say, that it is preferred that the first fluid and the second fluid include water.

A second fluid flows in the second circuit 35 of the thermal conduction system 3 and conducts the second heat flow 20 from the second device 2 to the second side 341 of the thermal conduction system 34. The second side 341 can be designated as the warm side of the heat exchanger 34.

The thermal conduction system 3 can be operated in a normal operating mode. To this end, the control unit 37 sets the valves 372 in the second device 2 such that the facility 22 of the second device 2 is not directly fluidly connected with the second side 341 of the heat exchanger 34, that is to say, the second fluid does not flow within the subcircuit 354.

In the normal operating mode of the thermal conduction system 3 depicted in FIG. 1, the second fluid flows respectively from the second device 2 and from the second side 341 of the heat exchanger 34 to the thermoelectric generator 32 and from the thermoelectric generator 32 to the second side 341 of the heat exchanger 34.

The thermoelectric generator 32 generates an electrical power by means of a temperature difference $\Delta T$ between a first inlet temperature $T_{G1}$ of the second fluid and a second inlet temperature $T_{G2}$ of the second fluid, $\Delta T = T_{G1} - T_{G2}$, and provides the electrical power generated for the operation of the thermal conduction system 3 and/or of the second device 2.

Specifically, the second fluid flows initially from the second device 2 to the heat accumulator 30 and from the heat accumulator 30 back to the second device 2, that is to say, the second fluid flows in the subcircuit 353. The second fluid located in the heat accumulator 30 exhibits a storage temperature $T_A$, which corresponds to the heat stored in the heat accumulator 30. It is clear that, during the startup phase of the method, the heat stored in the heat accumulator 30 gradually increases and the temperature of the second fluid located in the heat accumulator 30 climbs to the storage temperature $T_A$ during the startup phase. The heat accumulator 30 increases the first inlet temperature $T_{G1}$ of the thermoelectric generator and increases the temperature difference $\Delta T$.

The second fluid flows from the second device 2, more specifically from the heat accumulator 30, to the solar heating system 31 which generates the third heat flow 310, absorbs the third heat flow 310 inside the solar heating system 31, and flows from the solar heating system 31 to the thermoelectric generator 32. The solar heating system 31 increases the first inlet temperature $T_{G1}$ and increases the temperature difference $\Delta T$.

The second fluid can flow from the second side 341 of the heat exchanger 34 into the storage buffer 33 of the thermal conduction system 3 and flow out of the storage buffer 33 to the second side 341 of the heat exchanger 34, to the heat accumulator 30, and to the thermoelectric generator 32. The second fluid located in the storage buffer 33 exhibits a buffer temperature $T_P$, which corresponds to the heat stored in the storage buffer 33 and is lower than the storage temperature $T_A$. It is clear that, during the startup phase of the method, the heat stored in the storage buffer 33 gradually increases and the temperature of the second fluid located in the storage buffer 33 climbs to the buffer temperature $T_P$ during the startup phase.

Alternatively to the normal operating mode, the thermal conduction system 3 can be operated in an emergency operating mode which differs from the normal operating mode, as well as a maintenance operating mode. To this end, the control unit 37 sets the valves 372 in the second device 2 such that the facility 22 of the second device 2 is directly fluidly connected with the second side 341 of the heat exchanger 34.

In the emergency operating mode, the second fluid flows from the second side 341 of the heat exchanger 34 directly to the second device 2 and from the second device 2 directly to the second side 341 of the heat exchanger 34, that is to say, the second fluid flows exclusively within the subcircuit 354.

The degree of efficiency of the emergency operating mode is basically equal to the efficiency of the normal operating mode, if the thermal conduction system 3 includes no heat accumulator 30, no solar heating system 31, no thermoelectric generator 32, and no storage buffer 33, and the subcircuits 350, 351, 352, 353 coincide.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A system for cooling a device, the system comprising:
a first device configured to generate a first heat flow dependent upon operation and the first device is a potable water supply;
a space surrounding the first device and configured to absorb the first heat flow;
a second device which differs from the first device, the second device configured to generate a second heat flow, and the second device being a data center;
a second space surrounding the second device, the second space separate from the space, and the second device is thermally isolated from the second space; and
a thermal conduction system which thermally couples the second device and the first device to cool the second device and which is configured to conduct the second heat flow to the first device via a heat exchanger disposed between the first device and the second device, wherein no fluid which flows within the thermal conduction system is compressed or expanded,
wherein the potable water supply is configured to absorb the second heat flow and an operating power of at least one water heating system associated with at least one consumption point of the potable water supply is automatically reduced based on the absorbed second heat flow.

2. The system according to claim 1, wherein a second fluid flowing in a closed second circuit of the thermal conduction system is configured to conduct the second heat flow from the second device to a second side of the heat exchanger of the thermal conduction system, and a first fluid flowing in a closed first circuit of the thermal conduction system, which is separate from the second circuit, is configured to conduct the second heat flow from a first side of the heat exchanger to the first device.

3. The system according to claim 2, wherein in a normal operating mode of the thermal conduction system, the second fluid is configured to flow from the second device and from the second side of the heat exchanger to a thermoelectric generator of the thermal conduction system and from the thermoelectric generator to the second side of the heat exchanger, and the thermoelectric generator is configured to generate electrical power via a temperature difference between a first inlet temperature of the second fluid and a second inlet temperature of the second fluid, and to supply the electrical power generated for the operation of the thermal conduction system and/or of the second device.

4. The system according to claim 3, wherein the second fluid is configured to flow from the second device to a solar heating system which is configured to generate a third heat flow and from the solar heating system to the thermoelectric generator, and the solar heating system increases the first inlet temperature and increases the temperature difference.

5. The system according to claim 3, wherein the second fluid is configured to flow from the second device to a heat accumulator and from the heat accumulator to the second device and to the thermoelectric generator, and the heat accumulator increases the first inlet temperature and increases the temperature difference.

6. The system according to claim 5, wherein the second fluid is configured to flow from the second side of the heat exchanger into a storage buffer of the thermal conduction system and out of the storage buffer to the second side of the heat exchanger, to the heat accumulator, and to the thermoelectric generator.

7. The system according to claim 2, wherein in an emergency operating mode which differs from a normal operating mode of the thermal conduction system, the second fluid is configured to flow directly from the second side of the heat exchanger to the second device and from the second device directly to the second side of the heat exchanger.

8. The system according to claim 2, wherein a sensor of the thermal conduction system measures a physical property of the thermal conduction system, a pump of the thermal conduction system sets a volumetric flow rate of the first fluid or of the second fluid, and a valve of the thermal conduction system releases or restricts the flow of the first fluid or of the second fluid, and a control unit of the thermal conduction system controls the pump and the valve depending upon the physical property measured.

9. A method for cooling a device carried out with the system according to claim 1.

10. The method of claim 9, further comprising:

flowing a second fluid in a closed second circuit of the thermal conduction system to conduct the second heat flow from the second device to a second side of the heat exchanger of the thermal conduction system; and flowing a first fluid in a closed first circuit of the thermal conduction system, which is separate from the second circuit, to conduct the second heat flow from a first side of the heat exchanger to the first device.

11. The method of claim 10, further comprising:

in a normal operating mode of the thermal conduction system, flowing the second fluid from the second device and from the second side of the heat exchanger to a thermoelectric generator of the thermal conduction system and from the thermoelectric generator to the second side of the heat exchanger;

generating electrical power via a temperature difference between a first inlet temperature of the second fluid and a second inlet temperature of the second fluid by the thermoelectric generator; and supplying the electrical power generated for the operation of the thermal conduction system and/or of the second device.

12. The method of claim 11, further comprising:

flowing the second fluid from the second device to a solar heating system;

generating a third heat flow with the solar heating system, the solar heating system increasing the first inlet temperature and the temperature difference; and flowing the third heat flow from the solar heating system to the thermoelectric generator.

13. The method of claim 10, further comprising:

measuring a physical property of the thermal conduction system by a sensor of the thermal conduction system;

setting a volumetric flow rate of the first fluid or of the second fluid by a pump of the thermal conduction system;

releasing or restricting the flow of the first fluid or of the second fluid by a valve of the thermal conduction system; and controlling, by a control unit of the thermal conduction system, the pump and the valve based on the physical property measured.

* * * * *